United States Patent [19]

Potash

[11] 4,409,569
[45] Oct. 11, 1983

[54] FILTER CIRCUITS HAVING TRANSFORMERS AS FILTER ELEMENTS

[75] Inventor: Jerome Potash, Flemington, N.J.

[73] Assignee: OPT Industries, Inc., Phillipsburg, N.J.

[21] Appl. No.: 317,438

[22] Filed: Nov. 2, 1981

[51] Int. Cl.³ .................... H03H 7/09; H03H 7/075
[52] U.S. Cl. ............................... 333/177; 333/168
[58] Field of Search ..................... 333/167–171, 333/174, 175, 177–180, 24 R

[56] References Cited
FOREIGN PATENT DOCUMENTS
495455  6/1938  United Kingdom ............... 333/177

OTHER PUBLICATIONS

Jordan et al, "Fundamentals of Radio", Prentice–Hall, New York, 1952; Title page and pp. 113–115.

Primary Examiner—M. Nussbaum
Attorney, Agent, or Firm—Arthur L. Lessler

[57] ABSTRACT

Filter circuits of the type having inductance and capacitance elements, wherein the number of magnetic components is reduced by using two transformers to perform the functions of four individual inductors. Each transformer has one end of the primary winding connected to one end of the secondary winding, and a pi or T equivalent circuit in which one of the inductance values is equal in magnitude and opposite in sign to a corresponding equivalent circuit inductance value of the other transformer.

7 Claims, 19 Drawing Figures

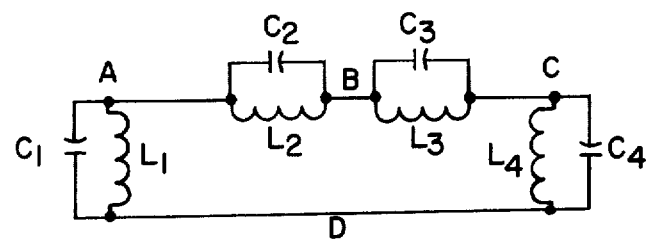
FIG.1 (PRIOR ART)
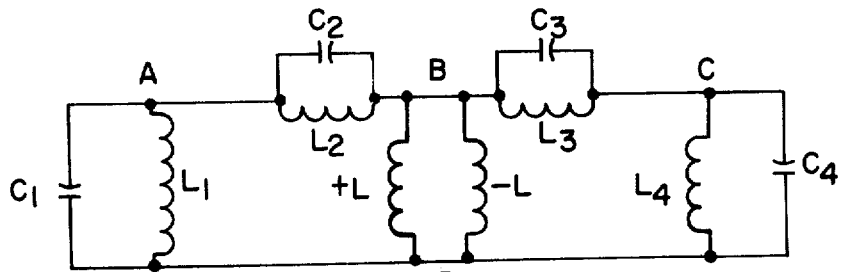
FIG.2
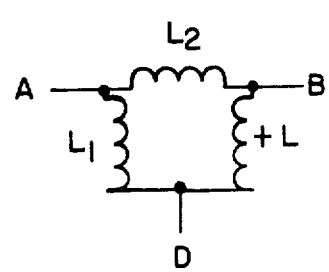
FIG.(3a)
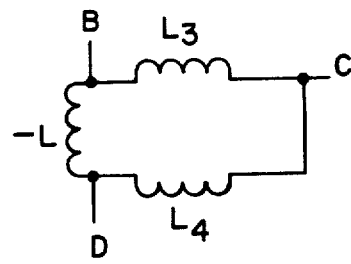
FIG.(3b)
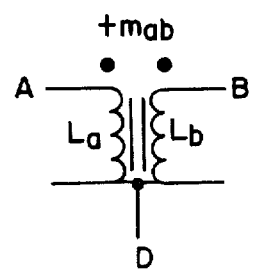
FIG.(4a)
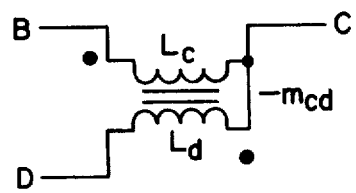
FIG.(4b)

FILTER CIRCUITS HAVING TRANSFORMERS AS FILTER ELEMENTS

BACKGROUND OF THE INVENTION

This invention relates to electric filter circuits and processes for manufacturing the same, and more particularly to filters which include a number of inductors.

In the design of filters having desired frequency response characteristics, it is frequently necessary or desirable to include a number of individual inductors. Such inductors are relatively expensive magnetic components and occupy a relatively large volume.

Accordingly, an object of the present invention is to provide filter circuits having desired frequency response characteristics similar to those of prior art filters of the aforementioned type, at reduced cost and in a smaller space.

SUMMARY

As herein described, there is provided an improved filter circuit comprising at least two transformers and having a frequency characteristic corresponding to that of a given filter circuit including at least four individual inductors, comprising a pair of transformers each having a T or pi network equivalent circuit wherein two inductance values correspond to those of two of said individual inductors, the third inductance value of one of said equivalent circuits being positive and the third inductance value of the other of said equivalent circuits being negative and equal to the third inductance value of the first-mentioned of said equivalent circuits, said transformers being interconnected so that said equivalent circuit third inductance values are in series or in parallel with each other, whereby the third inductance values do not affect the frequency characteristic of said filter circuit.

Also herein described is a process for manufacturing an improved filter circuit comprising at least two transformers and having a frequency characteristic corresponding to that of a given filter circuit including at least four individual inductors, comprising the steps of: representing said given circuit schematically; adding to the representation of said filter circuit a pair of positive and negative interim inductors having equal absolute values of inductance, the inductors of said pair being coupled in series or in parallel with each other so that the frequency characteristic of said filter circuit is not altered thereby, and so that each inductor of said pair cooperates with two adjacent individual inductors to form a T or pi network, wherein in each such network the absolute value of the inductance of the corresponding interim inductor is less than the square root of the product of the inductances of the individual inductors therein; and fabricating said improved filter circuit by providing a transformer to perform the function of each of said networks, each such transformer having an equivalent circuit corresponding to that of the respective network.

IN THE DRAWING

FIG. 1 shows a first type of filter circuit according to the prior art, having four individual inductance elements or inductors;

FIGS. 2, 3(a), 3(b), 4(a) and 4(b) illustrate intermediate steps in converting the prior art filter of FIG. 1 to a filter according to a first embodiment of the present invention;

Figure 11:
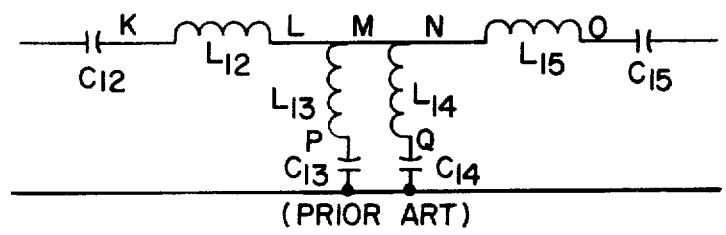
FIG. 11 shows a third type of prior art filter having four inductance elements.
Figure 13A:
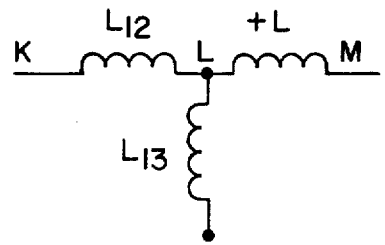
Figure 13B:
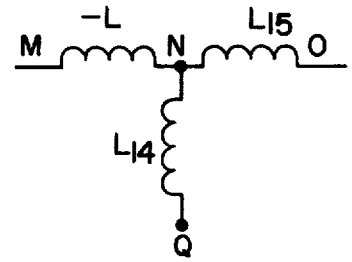
Figure 14A:
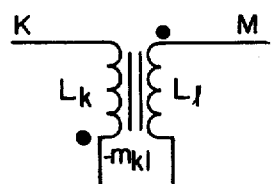
Figure 14B:
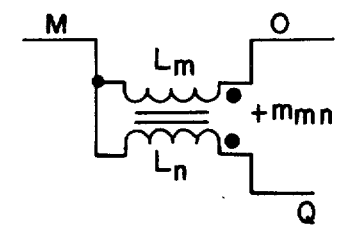
Figure 15:
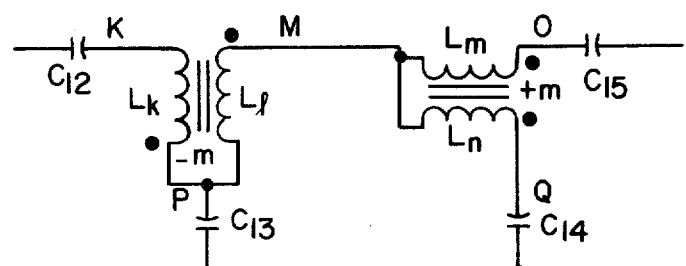

FIGS. 12, 13(a), 13(b), 14(a) and 14(b) show intermediate steps in converting the filter of FIG. 11 to a filter according to a fourth embodiment of the present invention; and FIG. 15 shows a filter according to said fourth embodiment of the invention.

DETAILED DESCRIPTION

The present invention, as hereinafter described in further detail, utilizes two transformers (or more than one group of two transformers) having parameters such that they provide frequency response characteristics similar to those of four individual inductors, thus reducing the number of individual magnetic components by two, resulting in a saving of cost and of space occupied by the filter.

One of the two transformers has its windings coupled in series aiding relationship [as shown for example in FIG. 4(b)], so that the mutual inductance m between the primary and secondary windings has a negative sign; the other transformer having its windings coupled in series opposing relationship [as shown for example in FIG. 4(a)], so that the mutual inductance therebetween has a positive sign. In this arrangement, the equivalent circuit of one transformer has two positive inductance values and one negative inductance value (see FIG. 3(b), for example), while the equivalent circuit of the other transformer has three positive inductance values (see FIG. 3(a), for example).

By properly setting the design parameters of each transformer, and the manner in which the transformers are interconnected, the negative equivalent circuit inductance value of one transformer may be "cancelled out" by one of the inductance values of the equivalent circuit of the other transformer, thus resulting in an equivalent circuit comprising four inductors. The transformers can be so designed that their combined equivalent circuit, comprising four inductors, has the same inductance values as those of the four individual inductors of the prior art filter circuit.

Figure 5:
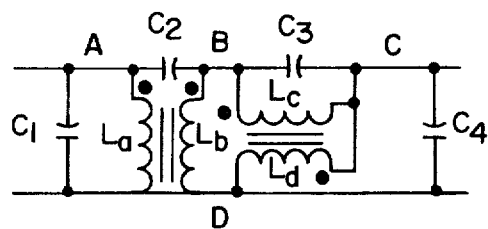
FIG. 5 shows a filter according to said first embodiment of the invention.

A first embodiment of the invention based on these principles is shown in FIG. 5, which circuit has a frequency characteristic similar to that of the prior art circuit shown in FIG. 1.

In converting the circuit of FIG. 1 to that of FIG. 5, two parallel inductors are added to the schematic representation of FIG. 1, said inductors having inductance values +L and −L respectively. The positioning of the added positive and negative inductance values is selected, as shown in FIG. 2, so that each of said added inductance values forms a delta or pi network with two adjacent individual inductors of the original prior art circuit. As seen in FIG. 2, the inductance value +L forms a first pi network with individual inductors $L_1$ and $L_2$; while the inductance value $-L$ forms a second pi network with individual inductors $L_3$ and $L_4$. These pi networks are shown in FIGS. 3(a) and 3(b) respectively.

The pi network shown in FIG. 3(a) is then replaced by the transformer shown in FIG. 4(a), said transformer having primary and secondary windings $L_a$ and $L_b$ connected in series opposing relationship to provide a positive sign for the mutual inductance $m_{ab}$ therebetween.

The pi network shown in FIG. 3(b) is replaced by the transformer shown in FIG. 4(b), said transformer having primary and secondary windings $L_c$ and $L_d$ connected in series aiding relationship to provide a negative sign for the mutual inductance $m_{cd}$ therebetween.

The positive and negative inductors L may be given any desired inductance value, so long as each said inductance value is less than the square root of the product of the other two inductance values in the corresponding pi network. That is, $$|L| < \sqrt{L_1 L_2} \text{ and } |L| < \sqrt{L_3 L_4}$$

The equations which interrelate the inductance parameters of each of the transformers shown in FIGS. 4(a) and 4(b) with the inductance values of the corresponding or "equivalent" pi networks shown in FIGS. 3(a) and 3(b) respectively are as follows:

$$L_a = \frac{L_1(L_2 + L)}{L_1 + L_2 + L} \quad (1a)$$

$$L_b = \frac{L(L_2 + L_1)}{L_1 + L_2 + L} \quad (1b)$$

$$m_{ab} = \frac{L_1 L}{L_1 + L_2 + L} \quad (1c)$$

$$L_c = \frac{L_3(L_4 - L)}{L_3 + L_4 - L} \quad (2a)$$

$$L_d = \frac{L_4(L_3 - L)}{L_3 + L_4 - L} \quad (2b)$$

$$m_{cd} = \frac{L_3 L_4}{L_3 + L_4 - L} \quad (2c)$$

When the transformers shown in FIGS. 4(a) and 4(b) are substituted for their equivalent pi networks as shown in FIG. 2, the resulting filter is as shown in FIG. 5. Since each of the transformers occupies little more space, and entails little more cost than a single one of the inductors $L_1$ through $L_4$, the filter of FIG. 5 provides a considerable improvement in terms of cost and space, over that of FIG. 1.

Figure 6:
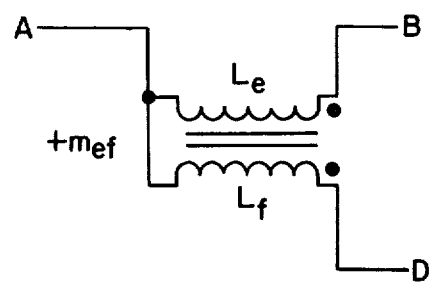
FIG. 6 illustrates an intermediate step (in conjunction with FIGS. 2, 3(a), 3(b), and 4(b) in converting the filter of FIG. 1 to a filter according to a second embodiment of the present invention.
Figure 7:
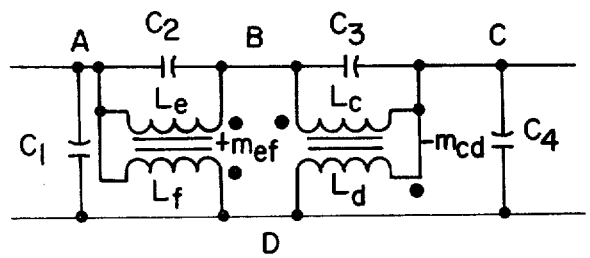
FIG. 7 shows a filter according to said second embodiment of the invention.

Instead of using the transformer configuration shown in FIG. 4(a), the transformer configuration shown in FIG. 6 may alternatively be employed. In such event the equations which interrelate the parameters of the transformer of FIG. 6 with the equivalent pi network of FIG. 3(a) are as follows:

$$L_e = \frac{L_2(L_1 + L)}{L_1 + L_2 + L} \quad (3a)$$

$$L_f = \frac{L_1(L_2 + L)}{L_1 + L_2 + L} \quad (3b)$$

$$m_{ef} = \frac{L_1 L_2}{L_1 + L_2 + L} \quad (3c)$$

and the resulting circuit is as shown in FIG. 7.

Figure 8:
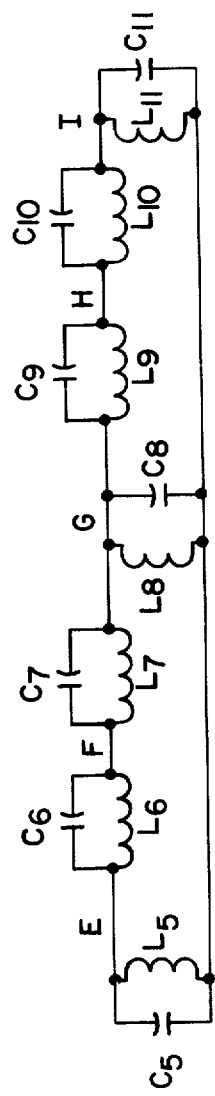
FIG. 8 shows a second type of prior art filter; having more than four inductance elements.

A somewhat more complex prior art circuit is shown in FIG. 8, which conduit includes seven individual inductors. Using techniques previously described with reference to FIGS. 1 to 5, the filter circuit shown in FIG. 10 can be provided, with only four magnetic components, and having a similar frequency characteristic to that of FIG. 8.

Figure 9:
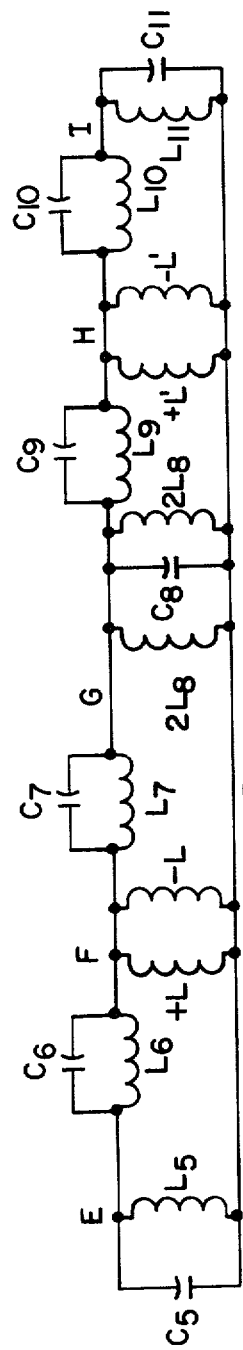
FIG. 9 shows an intermediate step in converting the filter of FIG. 8 to a filter according to a third embodiment of the present invention.

As shown in FIG. 9, which is similar in principle to FIG. 2, schematic representations of a pair of positive and negative inductance values +L and $-L$ are provided, in such a way that the elements $L_5$, $L_6$ and +L form one pi network, while the elements $-L$, $L_7$ and $2L_8$ form an adjacent pi network. The representation of the inductor $L_8$ is changed to two parallel inductance values of $2L_8$ each (combined inductance equal to $L_8$), in order to facilitate formation of third ($2L_8$, $L_9$, +L') and fourth ($-L'$, $L_{10}$, $L_{11}$) pi networks including a second pair of positive and negative inductance values +L' and $-L'$.

Each of the pi networks is then replaced by a transformer having a corresponding equivalent circuit.

The equations which interrelate the parameters of the left hand pair of transformers shown in FIG. 10 with the equivalent pi networks shown in FIG. 9 are as follows:

$$L_g = \frac{L_5(L_6 + L)}{L_5 + L_6 + L} \quad (4a)$$

$$L_h = \frac{L(L_5 + L_6)}{L_5 + L_6 + L} \quad (4b)$$

$$m_{gh} = \frac{L_5 L}{L_5 + L_6 + L} \quad (4c)$$

$$L_i = \frac{L_7(2L_8 - L)}{L_7 + 2L_8 - L} \quad (5a)$$

$$L_j = \frac{2L_8(L_7 - L)}{L_7 + 2L_8 - L} \quad (5b)$$

$$m_{ij} = \frac{2L_7 L_8}{L_7 + 2L_8 - L} \quad (5c)$$

Figure 10:
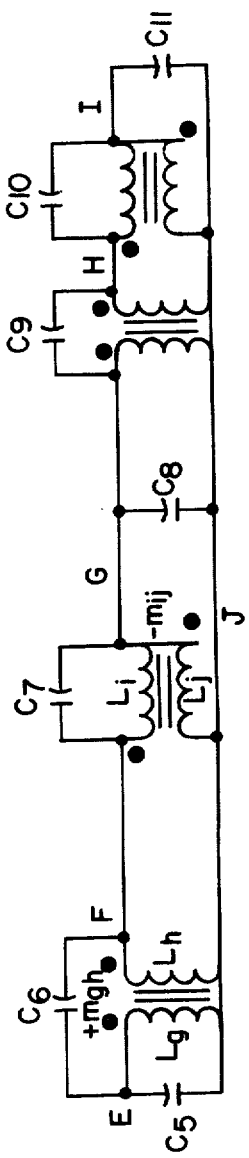
FIG. 10 shows a filter according to said third embodiment of the invention.

The equations which interrelate the parameters of the right hand pair of transformers shown in FIG. 10 with the equivalent pi networks shown in FIG. 9 have the same form as equations 4a through 5c, with corresponding changes in similar variables.

While all of the aforementioned transformer filter circuits have been arrived at by use of intermediate pi networks, it is also possible to utilize intermediate wye or T networks to arrive at equivalent transformer filter circuits, as illustrated in FIGS. 11 to 15, by adding series combinations of positive and negative inductance values to prior art filter circuits.

Figure 12:
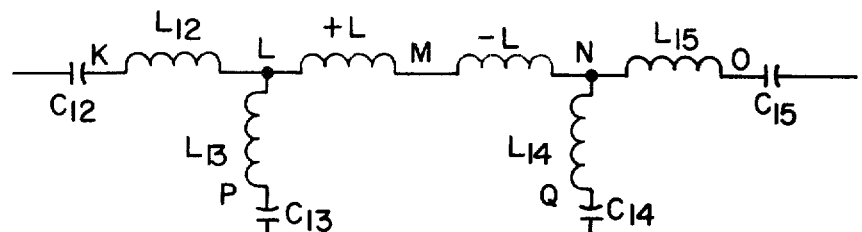

As shown in FIG. 12, the schematic representation in FIG. 11 is modified (without altering its frequency response characteristics) by adding a series combination of inductance values +L and −L, at a position in the circuit such that the added inductance element +L forms a T network with the individual inductors $L_{12}$ and $L_{13}$; while the added inductance element −L forms a T network with the indivdual inductors $L_{14}$ and $L_{15}$. These T networks are shown in FIGS. 13(a) and 13(b) respectively, while the corresponding transformers are shown in FIGS. 14(a) and 14(b) respectively.

The equations which interrelate the parameters of each transformer with the inductance values of the corresponding equivalent circuit are as follows:

$$L_k = L_{12} + L_{13} \tag{6a}$$

$$L_l = L_{13} + L \tag{6b}$$

$$m_{kl} = L_{13} \tag{6c}$$

$$L_m = L_{15} - L \tag{7a}$$

$$L_n = L_{14} - L \tag{7b}$$

$$m_{mn} = -L \tag{7c}$$

and the resulting transformer-based circuit is shown in FIG. 15, said circuit having a frequency characteristic similar to that of the circuit of FIG. 11, but requiring two less magnetic components.

Since the only restriction on the inductance values added to the prior art filter circuit is that the magnitude of each such value should be less than the square root of the product of the other two inductors of the corresponding pi or T network, a great deal of circuit design flexibility is available, allowing the design of the transformers employed in the filter circuits to be optimized.

In filter circuits where high permeability magnetic cores for the inductors, e.g. ferrite or iron, are required, the savings provided by the circuits shown in FIGS. 5, 7, 10 and 15, for example, can be quite substantial.

I claim:

1. An improved filter circuit comprising at least two transformers and having a frequency characteristic corresponding to that of a given filter circuit including at least four individual inductors, comprising a pair of transformers each having a T or pi network equivalent circuit consisting of three inductance values, wherein two inductance values correspond to those of two of said individual inductors, the third inductance value of one of said equivalent circuits being positive and the third inductance value of the other end of said equivalent circuits being negative and equal to the third inductance value of the first-mentioned of said equivalent circuits, said transformers being interconnected so that said equivalent circuit third inductance values are in series or in parallel with each other, whereby the third inductance values do not affect the frequency characterisitc of said filter circuit, each transformer having a primary winding and a secondary winding, one end of the primary winding of each transformer being connected to one end of the secondary winding thereof so that said windings are effectively connected in series with each other, the windings of one transformer being connected in series aiding relationship and the windings of the other transformer being connected in series opposing relationship.

2. The filter circuit according to claim 1, wherein at least one end of one winding of one transformer is directly connected to one end of one winding of the other transformer.

3. The filter circuit according to claim 1, wherein the other end of said one winding of said one transformer is directly connected to one end of the other winding of said other transformer.

4. The filter circuit according to claim 1, 2, or 3, wherein the magnitude of said third inductance value of each of said equivalent circuits is less than the square root of the product of said two inductance values thereof.

5. An improved filter circuit comprising at least two transformers and having a frequency characteristic corresponding to that of a given filter circuit including at least four individual inductors, comprising a pair of transformers each having a T or pi network equivalent circuit consisting of three inductance values, wherein two inductance values correspond to those of two of said individual inductors, the third inductance value of one of said equivalent circuits being positive and the third inductance value of the other of said equivalent circuits being negative and equal to the third inductance value of the first-mentioned of said equivalent circuits, said transformers being interconnected so that said equivalent circuit third inductance values are in series or in parallel with each other, whereby the third inductance values do not affect the frequency characteristic of said filter circuit, each transformer having a primary winding and a secondary winding, one end of the primary winding of each transformer being connected to one end of the secondary winding thereof so that said windings are effectively connected in series with each other, the windings of one transformer being connected in series aiding relationship and the windings of the other transformer being connected in series opposing relationship, the primary and secondary windings of one transformer being connected in series across one winding of the other transformer.

6. An improved filter circuit comprising at least two transformers and having a frequency characteristic corresponding to that of a given filter circuit including at least four individual inductors, comprising a pair of transformers each having a T or pi network equivalent circuit consisting of three inductance values, wherein two inductance values correspond to those of two of said individual inductors, the third inductance value of one of said equivalent circuits being positive and the third inductance value of the other of said equivalent circuits being negative and equal to the third inductance value of the first-mentioned of said equivalent circuits, said transformers being interconnected so that said equivalent circuit third inductance values are in series or in parallel with each other, whereby the third inductance values do not affect the frequency characteristic of said filter circuit, each transformer having a primary winding and a secondary winding, one end of the primary winding of each transformer being connected to one end of the secondary winding thereof so that said windings are effectively connected in series with each other, the windings of one transformer being connected in series aiding relationship and the windings of the other transformer being connected in series opposing relationship, the series combination of the primary and secondary windings of one transformer being connected in parallel with the series combination of the primary and secondary windings of the other transformer.

7. An improved filter circuit comprising at least two transformers and having a frequency characteristic corresponding to that of a given filter circuit including at least four individual inductors, comprising a pair of transformers each having a T or pi network equivalent circuit consisting of three inductance values, wherein two inductance values correspond to those of two of said individual inductors, the third inductance value of one of said equivalent circuits being positive and the third inductance value of the other of said equivalent circuits being negative and equal to the third inductance value of the first-mentioned of said equivalent circuits, said transformers being interconnected so that said equivalent circuit third inductance values are in series or in parallel with each other, whereby the third inductance values do not affect the frequency characteristic of said filter circuit, the magnitude of said third inductance value of each of said equivalent circuits being less than the square root of the product of said two inductance values thereof.

* * * * *